United States Patent [19]

Chappell et al.

[11] Patent Number: 4,491,748
[45] Date of Patent: Jan. 1, 1985

[54] HIGH PERFORMANCE FET DRIVER CIRCUIT

[75] Inventors: Barbara A. Chappell, Amawalk; Stanley E. Schuster, Granite Springs, both of N.Y.

[73] Assignee: International Business Machines Corporation, Armonk, N.Y.

[21] Appl. No.: 254,806

[22] Filed: Apr. 16, 1981

[51] Int. Cl.³ ............... H03K 19/017; H03K 19/096; H03K 17/04; G11C 8/00
[52] U.S. Cl. ............................ 307/449; 307/450; 307/482; 307/463; 307/578; 307/270
[58] Field of Search ............... 307/449, 450, 463, 482, 307/574, 577, 578, 581, 584, 270, 475

[56] References Cited

U.S. PATENT DOCUMENTS

| | | | |
|---|---|---|---|
| 3,718,826 | 2/1973 | Donofrio et al. | 307/449 |
| 3,775,693 | 11/1973 | Proebsting et al. | 330/205 |
| 3,995,171 | 11/1976 | Sonoda | 307/270 X |
| 4,065,678 | 12/1977 | Reese et al. | 307/205 |
| 4,071,783 | 1/1978 | Knepper | 307/205 |
| 4,081,699 | 3/1978 | Hirt et al. | 307/270 |
| 4,135,102 | 1/1979 | Green et al. | 307/205 |
| 4,307,308 | 12/1981 | Sano | 307/475 |
| 4,381,460 | 4/1983 | Menachem | 307/449 |

FOREIGN PATENT DOCUMENTS 46-1767  1/1971  Japan ................... 307/449

OTHER PUBLICATIONS

Patel, "Precharge for Bootstrap Circuit", IBM Tech. Discl. Bull., vol. 20, No. 7, pp. 2748, 12/77.
Love, "In-Phase Weak-Signal Input Circuit", IBM Tech. Discl. Bull., vol. 19, No. 12, pp. 4673, May 1977.
Hardee et al., a preprint article entitled, "A 30ns/375mW 16K×1 Static MOS RAM", submitted on or about Oct., 1980 to the Feb., 1981 ISSCC.
Takahashi et al., article entitled, "High Speed 4k Static RAM Using DAS MOST's" Proceedings of the 9th Conference on Solid State Devices, Tokyo, 1977.

Primary Examiner—Stanley D. Miller
Assistant Examiner—David R. Bertelson
Attorney, Agent, or Firm—John J. Goodwin

[57] ABSTRACT

An FET high performance driver circuit which is especially effective in an environment wherein both large input and output capacitive loads are present is described. The driver features a push-pull output circuit, a clocked load, and a switched transfer depletion FET adapted to decouple the large input capacitive load from an internal node of the driver circuit. This switched decoupling allows an isolation of the large input capacitance from the internal node, whereby the internal node potential can be raised rapidly, and the bootstrapping effectiveness at the internal node can be enhanced so as to significantly increase the circuit operating speed in driving large output capacitive loads.

6 Claims, 3 Drawing Figures

HIGH PERFORMANCE FET DRIVER CIRCUIT

DESCRIPTION

1. Technical Field

This invention relates generally to large scale integrated (LSI) circuit technology, and more particularly to an FET driver circuit which is capable of high speed operation in an environment wherein both large input and output capacitive loads are present.

2. Background Art

There is a growing need for high performance FET driver circuits which are well suited for LSI applications. This need is particularly acute in an FET type static random access memory (RAM) design where very high speed access is the main object. There are quite a few considerations which contribute to driver circuit performance. The allowable allocated power to which a driver circuit is limited is an important consideration. However, there is generally little control over this factor since the maximum power dissipation of an LSI chip is limited and such power must be allocated to many circuits contained thereon. Aside from the power design consideration, the high performance characteristics of a driver circuit also depends on the size of its input and output capacitive loads. The particular driver circuit configuration and design, of course, contributes appreciably to its performance. For a given power design and load conditions, it is no trite effort to create a novel configuration which produces optimum performance characteristics. Conventional FET driver circuits employing both enhancement and depletion modes FETs in a push-pull configuration are well known. An example of such a driver circuit is described in U.S. Pat. No. 3,775,793 to Proebsting. In addition, both U.S. Pat. Nos. 4,065,678 to Reese, et al, and 4,071,783 to Knepper, disclose high speed FET driver circuits employing a push-pull circuit and feedback techniques for driving high capacitive loads.

Some prior driver circuits employ FET devices having different threshold to increase the performance of the driver circuits. For instance, U.S. Pat. No. 4,135,102 to Green, et al, describes a high performance driver circuit using FETs having varying threshold voltage produced by selectively varying ion implantation doses in the channels of the FETs and using a low threshold depletion mode FET, rather than a conventional depletion mode FET, in the output stage. The use of a similar driver circuit in a high speed static RAM is also described in an article by Takahashi, et al, entitled "High Speed 4K Static RAM Using DSA MOSTs", Proceeding of the 9th Conference on Solid State Devices, Tokyo, 1977; and in the Japanese Journal of Applied Physics, Vol. 17, (1978) 17-1, pp. 71–76.

In a prior article, a new logic configuration is described by Blaser, et al, entitled "FET Logic Configuration", Digest of the ISSCC, 1978, pp. 14–15. According to the article, the new logic configuration utilizes a depletion mode FET to reduce the logic signal levels so as to improve the speed power performance characteristics of conventional logic circuits. None of the above-described driver circuits is designed and optimized specifically to provide high speed operations in an environment wherein both the input and output capacitances are large. There is no teaching of a driver circuit configuration including a push-pull output circuit in combination with a switched transfer depletion FET adapted to decouple the large input capacitive load from an internal node of the driver circuit, whereby the internal node potential can be raised rapidly, and the bootstrapping effectiveness at the internal node can be enhanced so as to significantly increase the circuit operating speed in driving large output capacitive loads.

DISCLOSURE OF INVENTION

It is a principal object of this invention to provide an improved FET driver circuit which is capable of high speed operation in an environment wherein both large input and output capacitive loads are present.

It is another principal object of this invention to provide an improved FET driver circuit which is capable of making high speed transition from a low logic level to a high logic level.

It is also an object of this invention to provide an improved FET driver circuit which provide a full $V_{DD}$ high logic level output.

It is another object of this invention to provide an improved FET driver circuit which can be powered down during an inactive cycle to minimize power dissipation.

It is generally an object of this invention to provide an improved FET driver for static RAM to enhance the access speed of such memory.

These and other objects of the present invention can be achieved by way of a push-pull driver circuit incorporating a switched transfer device whereby the large input capacitance is decoupled from an internal node of the driver circuit. This switched decoupling allows isolation of the large input capacitance from said internal node, whereby said internal node potential can be raised rapidly, and the bootstrapping effectiveness at said node can be enhanced so as to significantly increase the circuit operating speed in driving large output capacitive loads. The novel driver configuration specifically comprises a noninverting push-pull output circuit having a first stage, a second stage, and a common internal node for receiving an input; a switched transfer device responsive to the output of said first stage for coupling an input logic signal to said internal node; and a clocked load circuit for charging said internal node.

The nature, principle and utility of the present invention will be better understood from the hereinafter detailed description of the invention when read in conjunction with the accompanying drawings.

BRIEF DESCRIPTION OF THE DRAWINGS

Details of the invention will be described in connection with the accompanying drawings, in which.

BEST MODE FOR CARRYING OUT THE INVENTION

Figure 1:
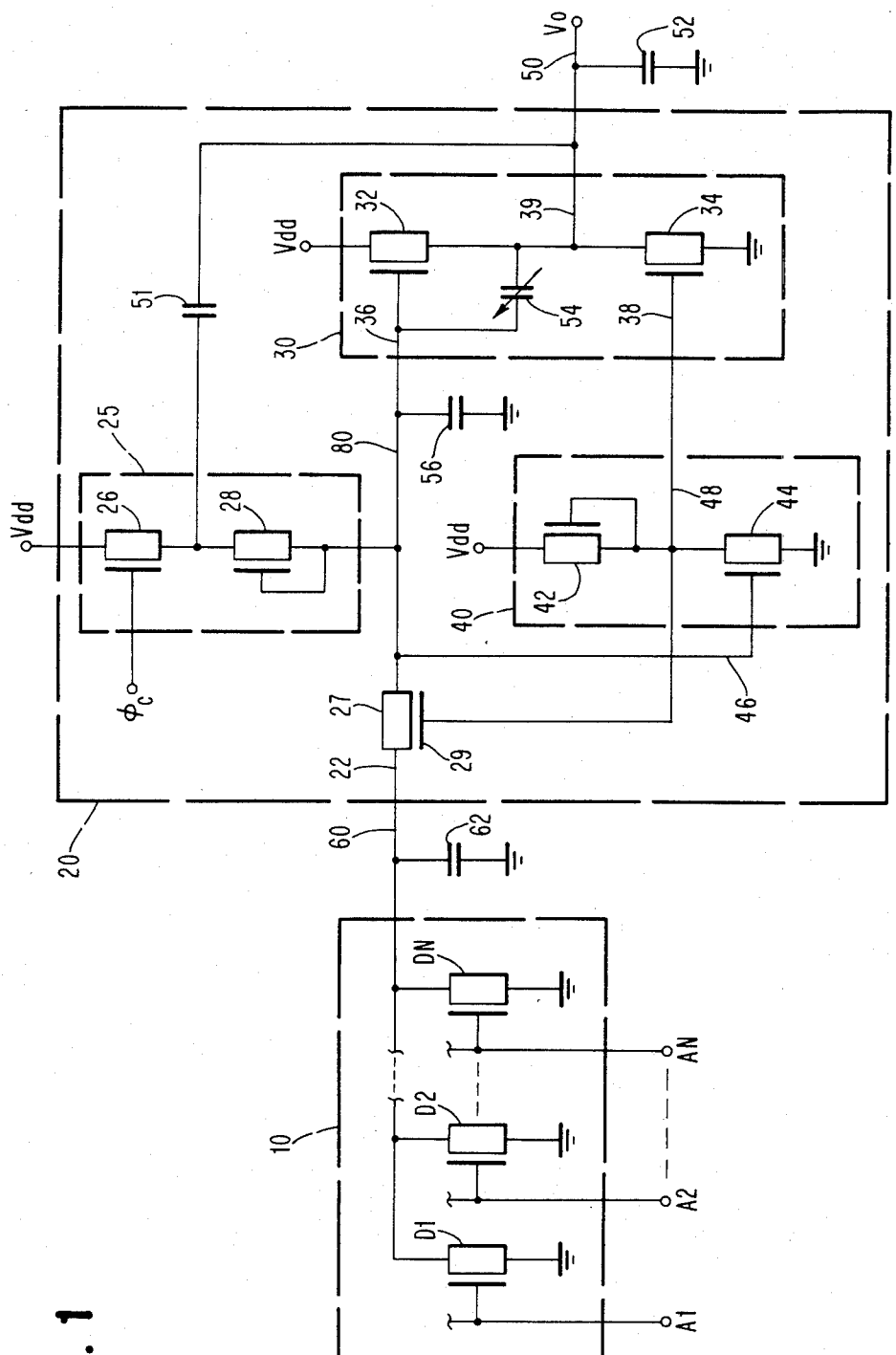
FIG. 1 is a schematic illustration of the high performance FET driver circuit according to the present invention, and with a decoder providing an input.

Referring to FIG. 1, a word decoder 10 in a static FET RAM is connected to a high performance driver 20 by way of a line 60 to select a word line 50. The equivalent capacitances of word line 50 and line 60 are represented by capacitors 52 and 62, respectively. Both capacitors 52 and 62 are comparatively large relative to the average nodal capacitance of a LSI circuit chip. The interconnections of word decoder 10, line 60, drive 20, and word line 50 form a critical path. The propagation delay of this critical path, among other factors, substantially determines the access speed of the static FET RAM.

The high performance driver 20 represented in FIG. 1 is preferrably fabricated in an N-channel FET technology wherein both enhancement mode and depletion mode FET devices, as well as zero threshold FET devices are constructed on a single silicon wafer.

According to the present invention, driver 20 includes a push-pull circuit 30, an inverter circuit 40, a load circuit 25, and a switched transfer FET device 27. Driver 20 is of the noninverting type, i.e., its input state is the same as its output state. More specifically, driver 20 features a large output drive capability, and is particularly effective in reducing critical path propagation delay in a circuit environment wherein both the input and the output capacitance are comparatively large.

Switched transfer FET 27 couples a digital input signal, which is present at line 60, from an input terminal 22 to an internal node 80 of driver 20. The load circuit 25 having FETs 26 and 28 couples $V_{DD}$, a first source of potential, to the internal node 80. The inverter 40, having FETs 42 and 44, is connected to the voltage source $V_{DD}$ and ground, a second source of potential. An input 46 of inverter 40 is connected to the internal node 80 and its output 48 is connected to the gate 29 of switched transfer FET 27. Push-pull circuit 30, having FET devices 32 and 34, is connected to the voltage source $V_{DD}$ and to ground. A second input 38 of the push-pull circuit 30 is connected to the output 48 of the inverter 40, and a first input 36 of push-pull circuit 30 is connected to the internal node 80 for manifesting the digital signal at an output terminal 39.

In the preferred embodiment, each of the FET devices of driver 20 are made selectively of either the enhancement mode, or depletion mode or zero threshold type. More specifically, referring to FIG. 1, devices 27, 28 and 42 are depletion mode type; devices 26 and 32 are zero threshold type; and devices 34 and 44 are enhancement mode type FETs. The novel aspect of this new driver circuit 20 configuration can best be understood by describing a complete cycle operation which is described next.

As an example of a complete cycle operation, consider the case wherein the decoder device $D_1$-$D_N$ of decoder 10 have been off. A2, one of the address lines $A_1$-$A_n$, goes high will turn on its associated decoder device $D_2$ causing line 60, input terminal 22, and internal node 80 to go low. This, in turn, will cause device 44 of inverter 40 to turn off and inverter output 48 to go high clamping the word line 50 low by way of device 34. In addition, the inverter output 48 rising will switch the transfer device 27 to a low impedance state. Since the current from load circuit 25 flows through the switched transfer device 27 when one of the decoder devices is on, reducing the impedance of the switched transfer device 27 has a significant effect because it lowers the potential at internal node 80 and thus prevents the output terminal 50 from rising by allowing device 32 to turn off. The impedance of switched transfer FET device 27 is reduced by a significant factor (approximately 10) as compared to the case where the transfer gate 29 is tied to a fixed ground potential as in the aforesaid Blaser conventional circuits. This reduction in impedance tends to discharge quickly the internal node 80 and substantially improves the high to low transition delay.

Next, consider the case wherein all the address lines $A_1$-$A_n$ go low turning the decoder devices $D_1$-$D_n$ off. Input terminal 22 and the internal node 80 will start to rise. The switched transfer device 27 will remain in the low impedance state during the initial part of this transient since the inverter output 48 is still high. However, as internal node 80 continues to rise, inverter output 48 will fall, putting the switched transfer FET device 27 into a high impedance state. Input terminal 22 will rise to a potential which is one threshold voltage below the gate potential of the switched transfer device 27, and then it turns off. When this occurs, the large capacitance associated with line 60 as represented by capacitor 62 is effectively decoupled from the internal node 80. As a result, the entire load current of loading circuit 25 now goes into charging internal node 80. Push-pull operation is achieved as internal node 80 rises and turns on device 32 thus charging the large capacitance associated with word line 50 represented by capacitor 52, and device 34 of the push-pull stage 30 is turned off by the low voltage at the inverter output node 48. Stated in another way, the switched transfer FET device 27 switches off during the initial phase of the low to high transition decoupling the relatively large capacitor 62 from the internal node 80. This decoupling charges capacitor 62 only to an intermediate voltage level below $V_{DD}$ and enables the entire load current to charge up a small (as compared to the size of capacitor 62) nodal capacitor represented by capacitor 56 rapidly. This rapid potential build up at internal node 80 together with the push-pull mode operation significantly improves the low to high transition delay. Detailed operation is to be described hereinafter in conjunction with FIG. 2.

Decoupling the internal node 80 from line 60 and its associated large capacitor 62 also enhances the effectiveness of the gate to source bootstrapping of device 32 by way of a gate to source capacitor 54. More specifically, the decoupling allows the bootstrapping effectiveness to be determined by capacitor 56 alone and not by the parallel combination of capacitors 56 and 62. Since capacitor 56 is relatively small compared to capacitor 62, the bootstrap enhancement is substantial. In addition, capacitor 51 may also be incorporated to provide increased bootstrapping effectiveness by coupling the positive going transient present at the output node 50 to the internal node 80 by way of device 28. These bootstrap enhancements in combination tend to drive device 32 harder and further improves the low to high transition delay as well as to provide a full $V_{DD}$ high logic level.

Figure 2:
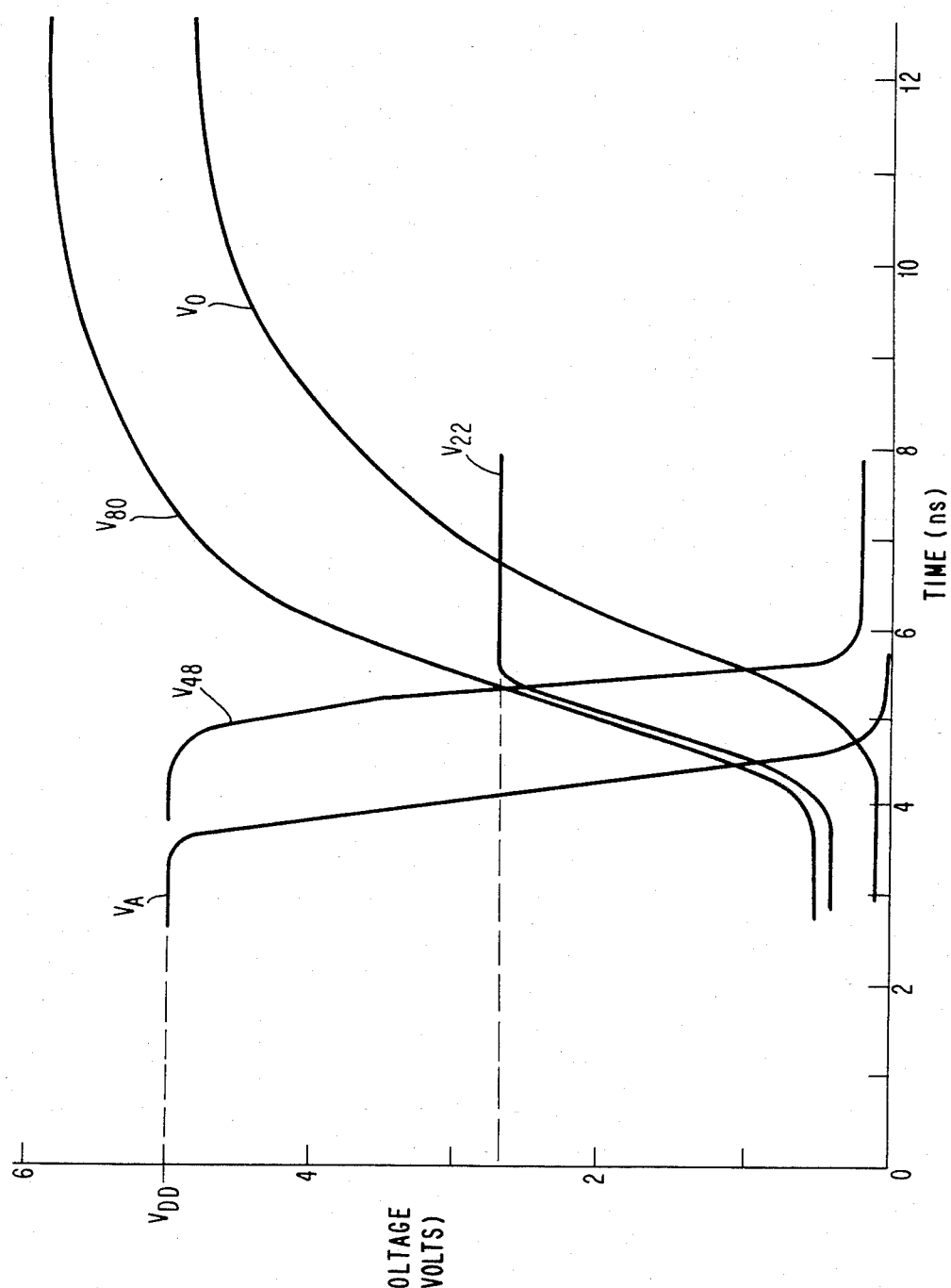
FIG. 2 illustrates the operation of the circuit in FIG. 1 driving a word line from a low logic level to a high logic level.

The aforesaid high performance driver 20 operation driving a selected word line 50 from a low to a high logic level is specifically illustrated in FIG. 2. $V_A$, the potential of every address lines $A_1$-$A_n$ goes low to permit both $V_{22}$, the potential of the input terminal 22 (FIG. 1) and $V_{80}$, the internal node 80 potential, to rise during the initial phase of this transition. The falling of $V_{48}$, the output voltage of inverter 40, in response to $V_A$ puts the switched transfer FET device 27 in a high impedance state from an initial low impedance state. This latter action decouples the relatively large capacitor 62 from the internal node 80. As a result $V_{22}$ is charged only to about 2.6 Volts, an intermediate potential below $V_{DD}$ while $V_{80}$ is allowed to charge up to $V_{DD}$ and beyond because of the above-described bootstrapping enhancements. The combined improvements as a result of decoupling the large capacitor 62, and the increased bootstrapping effectiveness permit $V_o$, the output node potential to rise rapidly in spite of the relatively large capacitance load 52.

Figure 3:
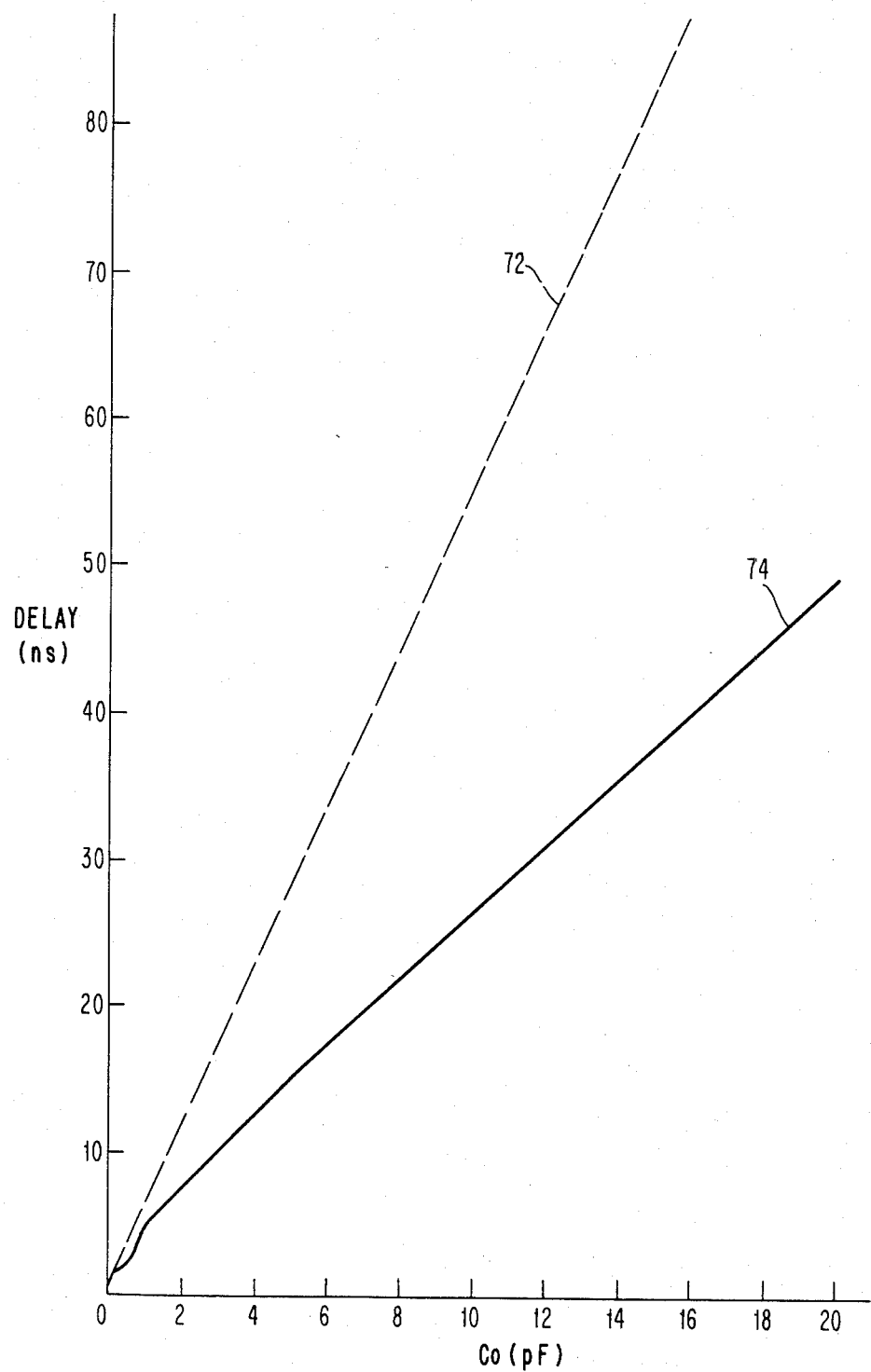
FIG. 3 characterizes driver circuit speed performance as a function of output capacitive load, with an input capacitive load of the same size. Curve 74 illustrates the performance characteristics of the driver circuit according to the present invention and 72 designates the same for a similar conventional non-inverting push-pull driver circuit operating at the same power level.

The improvement made possible utilizing this new and unobvious driver configuration is illustrated in FIG. 3. For equal size input and output capacitors 62 and 52, the performance improvement in circuit delay is significant. For example, with both capacitors 52 and 62 having a value of 10 pF, driver 20 according to the present invention has a transition delay of about 28 nanoseconds (curve 74 in FIG. 3), which is about twice the performance of a similar conventional non-inverting push-pull driver of identical power dissipation having a corresponding transition delay of about 60 nanoseconds (curve 72 in FIG. 3).

Referring to FIG. 1, it should be noted that load circuit 25 comprising the series combination of the depletion FET 28 and the zero threshold FET 26 can be selectively powered off to minimize power consumption. More particularly, the gate of the FET 26 may be clocked by $\phi_c$ to minimize power during that portion of a cycle that the associated decoder is not active. In addition it should be noted that as node 80 attempts to bootstrap above $V_{DD}$, FET 26 turns off facilitating $V_{80}$, the potential at node 80, to rise higher than $V_{DD}$ as shown by curve $V_{80}$ in FIG. 2.

While inverter 40 and push-pull circuit 30 are both described in the preferred embodiment above as separate and distinct circuits, the two circuits actually form a conventional non-inverting push-pull driver with inverter 40 as the first stage and circuit 30 as the second output stage. It may be helpful to view them as such in understanding and appreciating the present invention, especially for one skilled in this art.

Although the high performance FET driver circuit 20 as depicted in FIG. 1 is shown and described as incorporating zero threshold FETs 26, and 32, the driver circuit 20 operation is basically the same and the same substantial advantages can still be realized when driver 20 is fabricated in a technology wherein only standard depletion and enhancement mode FETs are available. In addition although load circuit 25 is shown to be clocked and to include a series combination of depletion mode FET 28 and the zero threshold FET 26 to minimize power, it is clear that the gate of FET 26 need not be clocked, and instead may be connected to $V_{DD}$. Furthermore, the load circuit may be substituted with a standard depletion FET load without substantial loss of the aforesaid performance advantages.

Although the above-described preferred embodiment of the present invention is shown and described in a static RAM environment, the above-described performance advantages can be realized generally in any situation wherein both large input and output capacitive loads are present. For example, driver 20 according to the present invention may be used advantageously for driving off-chip and inter-block large capacitive loads in situations wherein the input capacitive loads are high.

From the preceding detailed description of applicants' invention, it is described that driver circuits according to the present invention provide performance advantages heretofore not possible to achieve. In addition to the variations and modifications of applicants' disclosed driver circuit, which have been suggested, many variations and modifications will be apparent to those skilled in the art, and accordingly, the scope of applicants' invention is not to be construed to be limited to the particular embodiments shown or suggested.

We claim:

1. A driver circuit comprising:
   a depletion mode FET switched transfer means coupling a signal at an input terminal to an internal node of said driver circuit;
   a load coupling a first voltage source to said internal node for charging said internal node; and
   a push-pull output circuit, having a first stage including an inverter having an input connected to said internal node, an output terminal, and an input connected to said internal node for manifesting said signal at said output terminal, connected between said first voltage source and a second voltage source; the output of said first stage being coupled to said switched transfer means, a second stage including a zero threshold FET coupling said first voltage source to said output terminal, the gate of said zero threshold FET being connected to said internal node and an enhancement mode FET coupling said output terminal to said second voltage source, the gate of said second FET being connected to the output of said inverter;
   said switched transfer means being placed in a first state to provide a low impedance coupling between said internal node and said input terminal when the output of said first stage is at a high logic level;
   said switched transfer means being placed in a high impedance second state to provide an isolation of said internal node from said input terminal when the output of said first stage shifts from the high logic level to a low logic level, whereby said load charges said internal node to a high potential and charges said input terminal to an intermediate potential below the high potential of said internal node;
   said load including a third FET coupling said first voltage source to a feedback node, the gate of said third FET being connected to biasing means; and
   a fourth depletion mode FET coupling said feedback node to said internal node, the gate of said forth depletion mode FET being connected to said internal node.

2. A driver circuit as set forth in claim 1 wherein said third FET is a zero threshold FET, and the biasing means is connected to a control clock, whereby said load may be turned off to minimize power.

3. A driver circuit as set forth in claim 2 including a bootstrap capacitor coupling a positive-going transient present at said output terminal to said internal node by way of said feedback node.

4. A driver circuit comprising:
   a first source of potential;
   a second source of potential;
   a depletion mode FET switched transfer means coupling a digital signal at an input terminal to an internal node of said driver circuit;

a load circuit coupling said first source of potential to said internal node for charging said internal node;

an inverter connected between said first and second sources of potential;

the input of said inverter being connected to said internal node, and the output of said inverter being coupled to said switched transfer means;

said switched transfer means being placed in a first state to provide a low impedance coupling between said internal node and said input terminal when the output of said inverter is at a high logic level;

said switched transfer means being placed in a high impedance second state to provide an isolation of said internal node from said input terminal when the output of said inverter shifts from the high logic level to a low logic level, whereby said load circuit charges said internal node to a high potential and charges said input terminal to an intermediate potential below the high potential of said internal node; and a push-pull stage, having a first input, a second input, and an output terminal, connected between said first and said second sources of potential;

said second input of said push-pull stage being connected to the output of said inverter and said first input being connected to said internal node for manifesting said digital signal at said output terminal;

said push-pull stage including a first FET coupling said first voltage source to said output terminal, the gate of said first FET being connected to said internal node; and a second FET coupling said output terminal to said second voltage source, the gate of said second FET being connected to the output of said inverter;

said load circuit including a third FET coupling said first voltage source to a feedback node, the gate of said third FET being connected to biasing means; and a fourth depletion mode FET coupling said feedback node to said internal node, the gate of said fourth depletion mode FET being connected to said internal node.

5. A driver circuit as set forth in claim 4 wherein said third FET is a zero threshold FET, and the biasing means is connected to a control clock, whereby said load circuit may be powered off during an inactive cycle to minimize power.

6. A driver circuit as set forth in claim 5 including a bootstrap capacitor coupling a positive-going transient present at said output terminal to said internal node by way of said feedback node.

* * * * *